(12) United States Patent
Kao et al.

(10) Patent No.: US 8,750,031 B2
(45) Date of Patent: Jun. 10, 2014

(54) TEST STRUCTURES, METHODS OF MANUFACTURING THEREOF, TEST METHODS, AND MRAM ARRAYS

(75) Inventors: Ya-Chen Kao, Fuxing Township (TW); Tien-Wei Chiang, Taipei (TW); Chun-Jung Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 340 days.

(21) Appl. No.: 13/328,953

(22) Filed: Dec. 16, 2011

(65) Prior Publication Data

US 2013/0155759 A1  Jun. 20, 2013

(51) Int. Cl.
| | | |
|---|---|---|
| G11C 11/14 | (2006.01) | |
| H01L 23/58 | (2006.01) | |
| G11C 29/00 | (2006.01) | |
| H01L 21/66 | (2006.01) | |
| G11C 11/16 | (2006.01) | |
| H01L 23/544 | (2006.01) | |
| H01L 43/12 | (2006.01) | |

(52) U.S. Cl.
CPC ............... *G11C 11/14* (2013.01); *G11C 11/16* (2013.01); *G11C 29/00* (2013.01); *H01L 22/30* (2013.01); *H01L 23/544* (2013.01); *H01L 43/12* (2013.01); *H01L 23/58* (2013.01)
USPC ...... 365/158; 365/201; 257/48; 257/E23.002; 438/3

(58) Field of Classification Search
CPC ........ G11C 11/14; G11C 11/16; G11C 29/00; G11C 29/006; H01L 22/30; H01L 23/544; H01L 27/222; H01L 43/12; H01L 23/58
USPC ............ 365/158, 201; 257/48, E23.002, 257/E43.006; 438/3
See application file for complete search history.

(56) References Cited

U.S. PATENT DOCUMENTS

| | | | |
|---|---|---|---|
| 7,750,421 B2 * | 7/2010 | Horng et al. ................. 257/421 |
| 2009/0154229 A1 * | 6/2009 | Keshtbod .................... 365/171 |
| 2011/0051502 A1 * | 3/2011 | Rao et al. .................... 365/158 |
| 2012/0218805 A1 * | 8/2012 | Kim et al. ..................... 365/63 |

* cited by examiner

*Primary Examiner* — Toan Le
(74) *Attorney, Agent, or Firm* — Slater and Matsil, L.L.P.

(57) ABSTRACT

Test structures, methods of manufacturing thereof, test methods, and magnetic random access memory (MRAM) arrays are disclosed. In one embodiment, a test structure is disclosed. The test structure includes an MRAM cell having a magnetic tunnel junction (MTJ) and a transistor coupled to the MTJ. The test structure includes a test node coupled between the MTJ and the transistor, and a contact pad coupled to the test node.

20 Claims, 7 Drawing Sheets

US 8,750,031 B2

TEST STRUCTURES, METHODS OF MANUFACTURING THEREOF, TEST METHODS, AND MRAM ARRAYS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Some semiconductor devices comprise memory devices that are used to store information. A recent development in semiconductor memory devices is magnetic random access memory (MRAM) devices, in which the spin of electrons is used to indicate the presence of a "1" or "0" as digital information. MRAM devices comprise conductive lines (word-lines and bit-lines) positioned in different directions, e.g., perpendicular to one another in different metal layers. The conductive lines sandwich resistive memory elements that comprise magnetic tunnel junctions (MTJs), which function as magnetic memory cells. MTJs include two ferromagnetic layers separated by a thin insulating tunneling barrier. One ferromagnetic layer is a fixed or pinned layer and the other is a free layer that changes resistive state by a change in magnetic polarity when programmed. Digital information stored in an MTJ is read by detecting the MTJ's resistive state.

One type of MRAM device is a spin-transfer torque switched MRAM (STT-MRAM), in which local magnetization is used to program MTJs by exerting a spin torque on a magnetic moment of the free layer of MTJs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to test structures and methods for MRAM arrays. Novel test structures and testing methods will be described herein, as well as designs for MRAM arrays.

Figure 1:
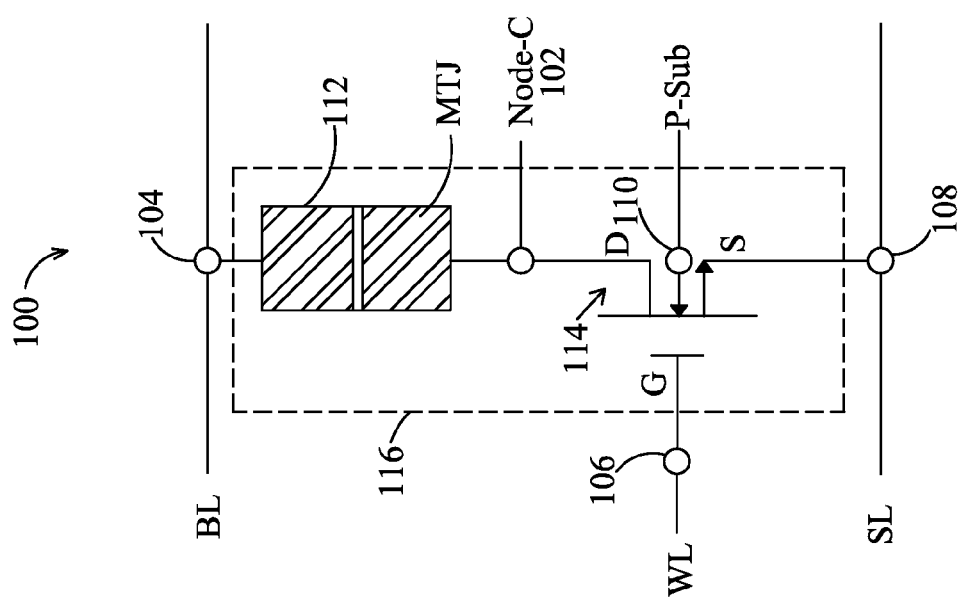
FIG. 1 is a schematic of a test structure in accordance with an embodiment of the present disclosure wherein a test node is coupled between an MTJ and a transistor.

Referring first to FIG. 1, a schematic of a test structure 100 in accordance with an embodiment of the present disclosure is shown. The test structure 100 includes an MRAM cell 116. The MRAM cell 116 may comprise a spin-transfer torque (STT) switched MRAM cell, for example, although alternatively, the MRAM cell 116 may comprise other types of magnetic memory devices. The test structure 100 includes a test node 102 (Node-C) that is coupled between an MTJ 112 and a transistor 114 of the MRAM cell 116, and a contact pad 148 (see FIG. 2) coupled to the test node 102.

The MRAM cell 116 includes the MTJ 112 and the transistor 114 which has a gate G, a source S, and a drain D. The transistor 114 may comprise a complementary metal oxide semiconductor (CMOS) device or a bipolar junction transistor (BJT), as examples, although alternatively, the transistor 114 may comprise other types of transistors. The transistor 114 may comprise a selection transistor coupled in series with the MTJ 112 in a uni-cell MRAM design, for example. The MTJ 112 is coupled at one end to the drain D of the transistor 114. The other end of the MTJ 112 is coupled to a bit-line BL of an MRAM array 152 (not shown in FIG. 1; see FIG. 3). The source S of the transistor 114 is coupled to a select-line SL of the MRAM array 152, and the gate G of the transistor 114 is coupled to a word-line WL of the MRAM array 152.

The test node 102 of the test structure 100 is also referred to herein as a first test node or Node-C (in the drawings). The test structure 100 includes a second test node 104 which is coupled to the bit-line BL and the MTJ 112, and a third test node 106 which is coupled to the word-line WL and the gate G of the transistor 114. The test structure 100 includes a fourth test node 108 coupled to the select-line SL and the source S of the transistor 114, and a fifth test node 110 coupled to a substrate P-sub of the transistor 114 or semiconductor device 118 (not shown in FIG. 1; see FIG. 2) that the test structure 100 is formed on.

In some embodiments, the MTJ 112 may be coupled to the source S of the transistor 114, rather than the drain D (not shown). In these embodiments, the drain D of the transistor 114 is coupled to the select line SL, the first test node 102 is coupled to the source S of the transistor 114, and the fourth test node 108 is coupled to the drain D of the transistor 114.

Figure 2:
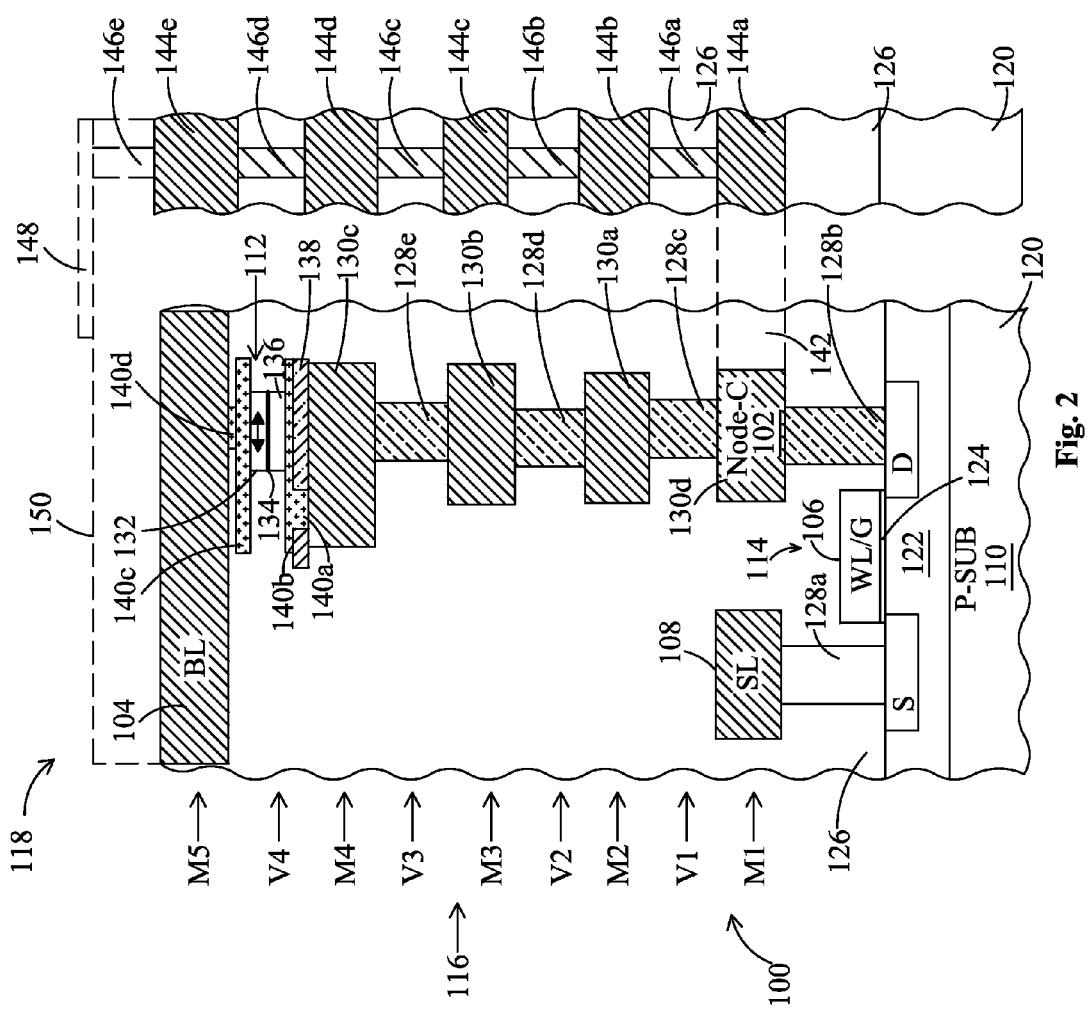
FIG. 2 shows a cross-sectional view of the test structure shown in FIG. 1 formed over a workpiece of a semiconductor device.

FIG. 2 shows a cross-sectional view of the test structure 100 of FIG. 1 formed over a workpiece 120 of a semiconductor device 118. The workpiece 120 comprises a substrate comprising silicon or other semiconductive materials. A plurality of conductive features is formed over the workpiece 120 within an insulating material 126. The conductive features comprise vias 128a, 128b, 128c, 128d, and 128e and conductive lines (or conductive segments) 130a, 130b, 130c, and 130d formed within the insulating material 126 in metallization layers M1, V1, M2, V2, M3, V3, M4, V4, and M5.

The insulating material 126 may comprise a plurality of insulating material layers, not shown, with etch stop layers being disposed between some or all of the insulating material layers, also not shown. The insulating material 126 may comprise silicon dioxide, undoped silicon glass (USG) oxide, or other insulators, and the conductive lines 130a, 130b, 130c, and 130d and vias 128a, 128b, 128c, 128d, and 128e may comprise copper, copper alloys, or other metals, as examples. Alternatively, the insulating material 126, conductive lines 130a, 130b, 130c, and 130d and vias 128a, 128b, 128c, 128d, and 128e may comprise other materials.

A portion of the workpiece 120 beneath the transistor 114 is doped with a P type material, forming a P-sub substrate that the fifth test node 110 of the test structure 100 is coupled to (see FIG. 1). Source S and drain D regions of the transistor 114 are formed in the workpiece 120. A gate dielectric 124 is formed over a channel region 122 of the transistor 114, and a gate G is formed over the gate dielectric 124. In the embodiment shown, the gate G of the transistor 114 is also part of a word-line WL of a MRAM array (see MRAM array 152 in FIG. 3), as shown. The word-line WL extends in and out of the paper in the view shown in FIG. 2, for example, and the word-line WL is also coupled to or comprises gates G of other transistors of MRAM cells 158 in the MRAM array 152 (see FIG. 3). The third test node 106 of the test structure 100 is coupled to the word-line WL in accordance with embodiments of the present disclosure.

A select-line SL for the MRAM array 152 is formed in metallization layer M1 that is disposed over the transistor 114. The fourth test node 108 of the test structure 100 is coupled to the select-line SL. The select-line SL is coupled to the source S of the transistor 114 by a via 128a. The first test node 102 (Node-C) is also formed in metallization layer M1, as shown. The first test node 102 comprises a conductive segment 130d that is coupled to the drain D of the transistor 114 by a via 128b. Vias 128a and 128b may comprise semiconductive materials, metals, or combinations or multiple layers thereof, for example.

A metallization layer V1 comprising a via layer is formed over the metallization layer M1, a metallization layer M2 is formed over the via layer V1, a metallization layer V2 comprising a via layer is formed over the metallization layer M2, and a metallization layer M3 is formed over the via layer V2. Metallization layers M2 and M3 may also include conductive lines formed in other regions of the semiconductor device 118, for example, not shown.

The MTJ 112 is formed within the insulating material 126 in an upper metallization layer such as via layer V4. The MTJ 112 comprises a pinned layer 136 and a free layer 132 that comprise magnetic materials, and a tunnel barrier 134 comprising a thin insulating material disposed between the pinned layer 136 and the free layer 132. The MTJ 112 also includes a seed contact 140a formed in an insulating material 138 that connects the MTJ 112 to a conductive segment 130c in metallization layer M4, and a bottom electrode 140b that is coupled between the pinned layer 136 and the seed contact 140a. A top electrode 140c of the MTJ 112 is disposed over the free layer 132 and is coupled to a bit-line BL in metallization layer M5 by a seed via 140d. The seed contact 140a, bottom electrode 140b, top electrode 140c, and seed via 140d may comprise conductive materials such as copper, copper alloys, or other metals, as examples, although alternatively, other materials may be used. The bit-line BL is coupled to a second test node 104 of the test structure 100 in accordance with embodiments of the present disclosure.

The other side of the MTJ 112, e.g., the bottom side in FIG. 2, is coupled to the first test node 102 by the conductive segment 130c in metallization layer M4, a via 128e in metallization layer V3, a conductive segment 130b in metallization layer M3, a via 128d in metallization layer V2, a conductive segment 130a in metallization layer M2, and a via 128c in metallization layer V1.

The first test node 102 (Node-C) is coupled to a contact pad 148 (shown in phantom in FIG. 2) disposed on a top surface 150 of the semiconductor device 118 by a connection region 142 coupled to a conductive segment 144a which are both disposed in metallization layer M1, a via 146a in metallization layer V1, a conductive segment 144b in metallization layer M2, a via 146b in metallization layer V2, a conductive segment 144c in metallization layer M3, a via 146c in metallization layer V3, a conductive segment 144d in metallization layer M4, a via 146d in metallization layer V4, a conductive segment 144e in metallization layer M5, and a via 146e disposed in an upper material layer of the semiconductor device 118, shown in phantom.

Note that other conductive lines/segments and vias may also be formed in the metallization layers M1, V1, M2, V2, M3, V3, M4, V4, and M5 elsewhere on the semiconductor device 118 in other regions, not shown. The configuration and lay-out of the MRAM cell 116 and metallization layers M1, V1, M2, V2, M3, V3, M4, and M5 is shown as an example; other designs of MRAM cells 116 may also include the test structure 100 described herein. Metallization layers M2 and M3 and via layers V1, V2, and/or V3 may not be included in the structure shown in FIG. 2, as one example.

The first test node 102 of the test structure 100 may be probed in order to test portions of the MRAM cell 116 by contacting the contact pad 148 on the top surface 150 of the semiconductor device 118. Additional contact pads are also disposed on the top surface 150 of the semiconductor device 118 that are coupled to the bit-line BL, word-line WL, select-line SL, and the substrate P-sub elsewhere on the semiconductor device 118, not shown. The contact pads for the bit-line BL, word-line WL, select-line SL, and the substrate P-sub may be used for testing portions of the MRAM cell 116 and also may be used during the operation of the MRAM cell 116, for example.

Figure 3:
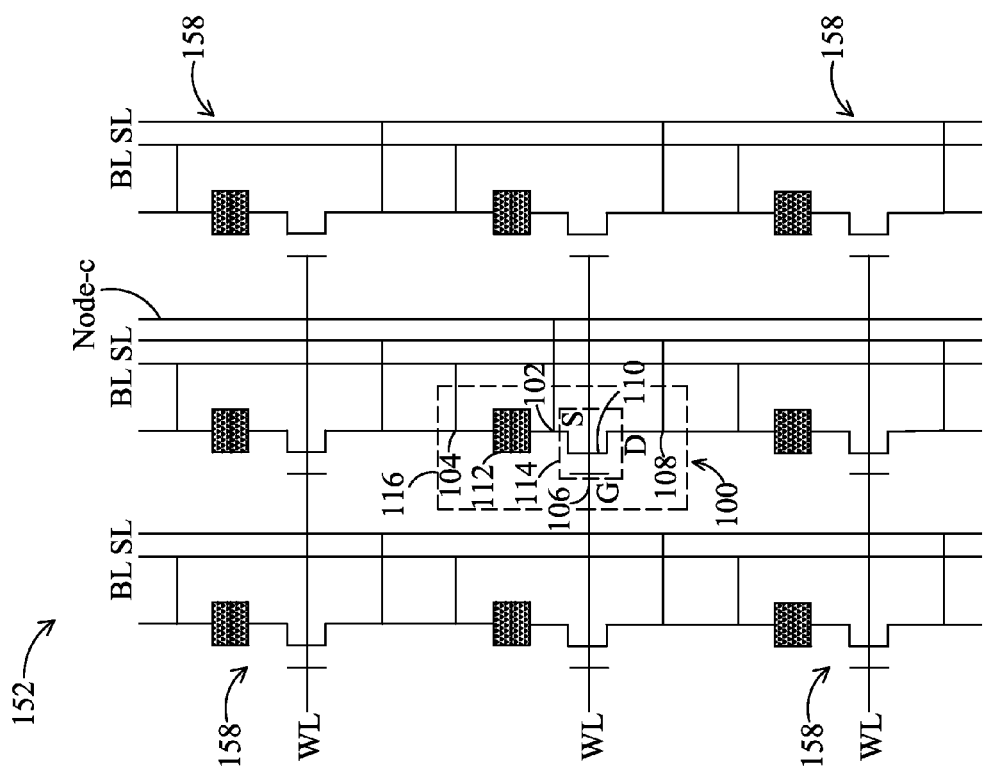
FIG. 3 is a schematic of an array of MRAM cells in accordance with an embodiment illustrating an application of the test structure.

FIG. 3 is a schematic of an array of MRAM cells 116 and 158 in accordance with an embodiment illustrating an application of the test structure 100. The test structure 100 comprises an MRAM cell 116 in a central region of an MRAM array 152 in this embodiment. The bit-line BL, word-line WL, and select-line SL are used to select and address the MRAM cell 116 during read and write operations of the MRAM array 152, for example, during the operation of the MRAM array 152. However, when the test structure 100 is used after fabrication of the semiconductor device 118 for wafer acceptance tests, the bit-line BL, word-line WL, and select-line SL, and also the substrate P-sub, may be used as and are adapted to function as test nodes 104, 106, 108, and 110 of the test structure 100 of the present disclosure. The other MRAM cells 158 in the MRAM array 152 do not include the test structure 100 in this embodiment and do not include a contact pad 148 coupled to a test node 102.

Again, the test nodes 102, 104, 106, 108, and 110 are accessible by contact pads disposed on a surface of the integrated circuit or semiconductor device that the MRAM cell 116 is formed on, such as the contact pad 148 shown in phantom in FIG. 2 that is coupled to the first test node 102 (the contact pads for test nodes 104, 106, 108, and 110 are not shown in the drawings.) The contact pads may be contacted using probe pins or probe needles in order to perform performance and/or characterization tests of the MTJ 112 or the transistor 114. The contact pads may also be electrically contacted to perform tests on both the MTJ 112 and the transistor 114, e.g., to test the overall MRAM cell 116.

The test structure 100 comprises a test key that may be used to test device performance with three types of device performance measurement as options, using different test node 102, 104, 106, 108 and 110 combinations. A combination of at least two of the test nodes 102, 104, 106, 108 and 110 may be used to perform a test on a partial portion or a full portion of the MRAM cell 116 of the test structure 100, for example. Table 1 shows some possible tests that may be performed using the test structure 100 for the three options for portions of the MRAM cell 116 of the test structure 100 that may be tested: the MTJ 112, the transistor 114, or both the MTJ 112 and transistor 114. The test nodes 102, 104, 106, 108, and 110 that would be utilized to test the three options are indicated in the table. The table also indicates the wafer acceptance tests (WAT) that may be performed using the test structure 100 for the three options.

TABLE 1

| Device/test node | Option 1: MTJ 112 | Option 2: Transistor 114 | Option 3: MTJ 112 + Transistor 114 (MRAM cell 116) |
|---|---|---|---|
| BL/ second test node 104 | X | | X |
| Node-C/ first test node 102 | X | X | |
| WL/ third test node 106 | | X | X |
| SL/ fourth test node 108 | | X | X |
| P-sub/ fifth test node 110 | | X | X |
| WAT test items: | RH loop, MTJ IV curves | Transistor IV curves | RH loop, MTJ IV curves, Transistor IV curves |

Figure 4:
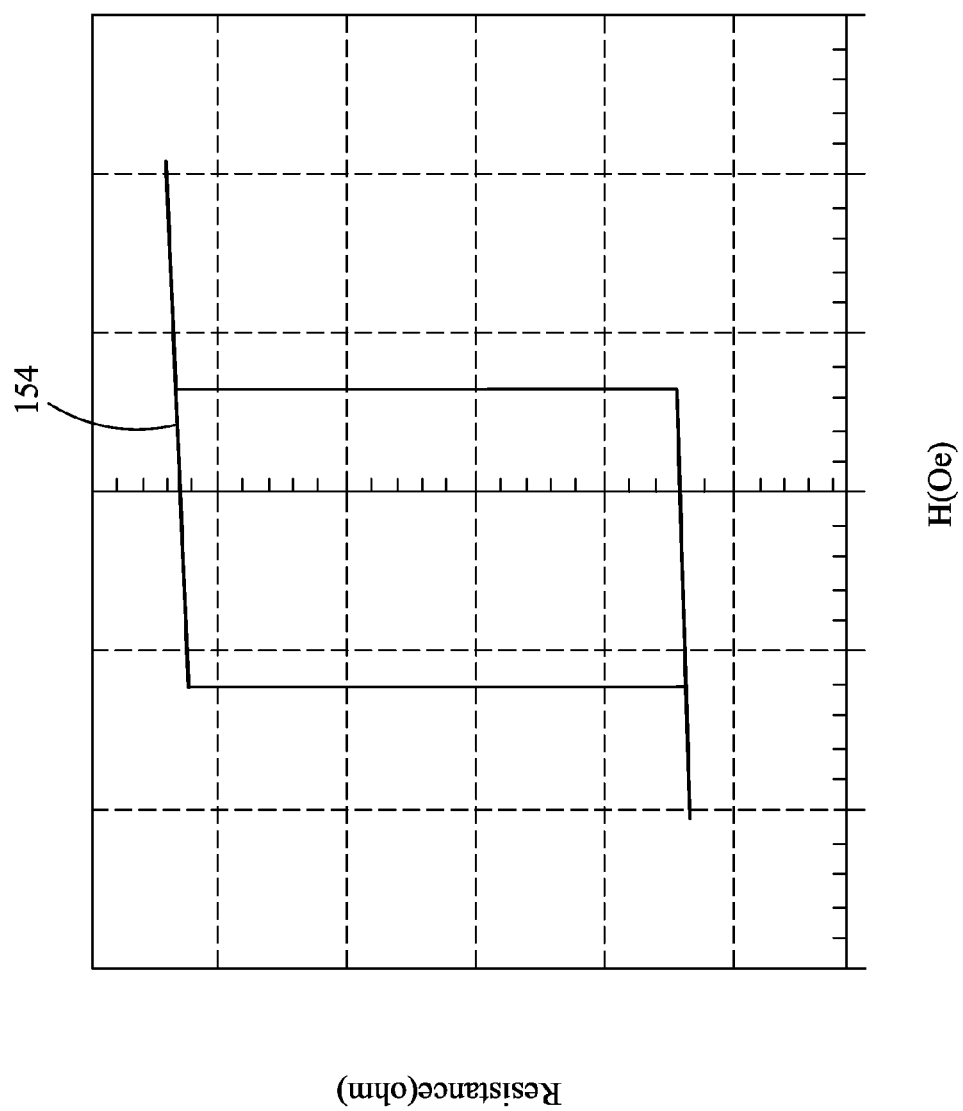
FIG. 4 is a graph illustrating a resistance-magnetic field (RH) loop that may be obtained using the test structure in accordance with an embodiment.

FIG. 4 is a graph 154 illustrating results of an RH loop test that may be performed using the test structure 100 in accordance with an embodiment. The RH loop graph 154 resulting from the test shows field switching results of the resistance of a device under test, such as the MTJ 112 or both the MTJ 112 and the transistor 114. The MTJ 112, or both the MTJ 112 and the transistor 114, exhibit hysteresis as a function of the magnetic field H, which is illustrated as a resistance-magnetic field loop (RH loop) in the graph 154. A range of magnetic fields H is applied to the portion of the MRAM cell 116 under test, and the resistance is measured and plotted for each magnetic field H to obtain the graph 154.

Figure 5:
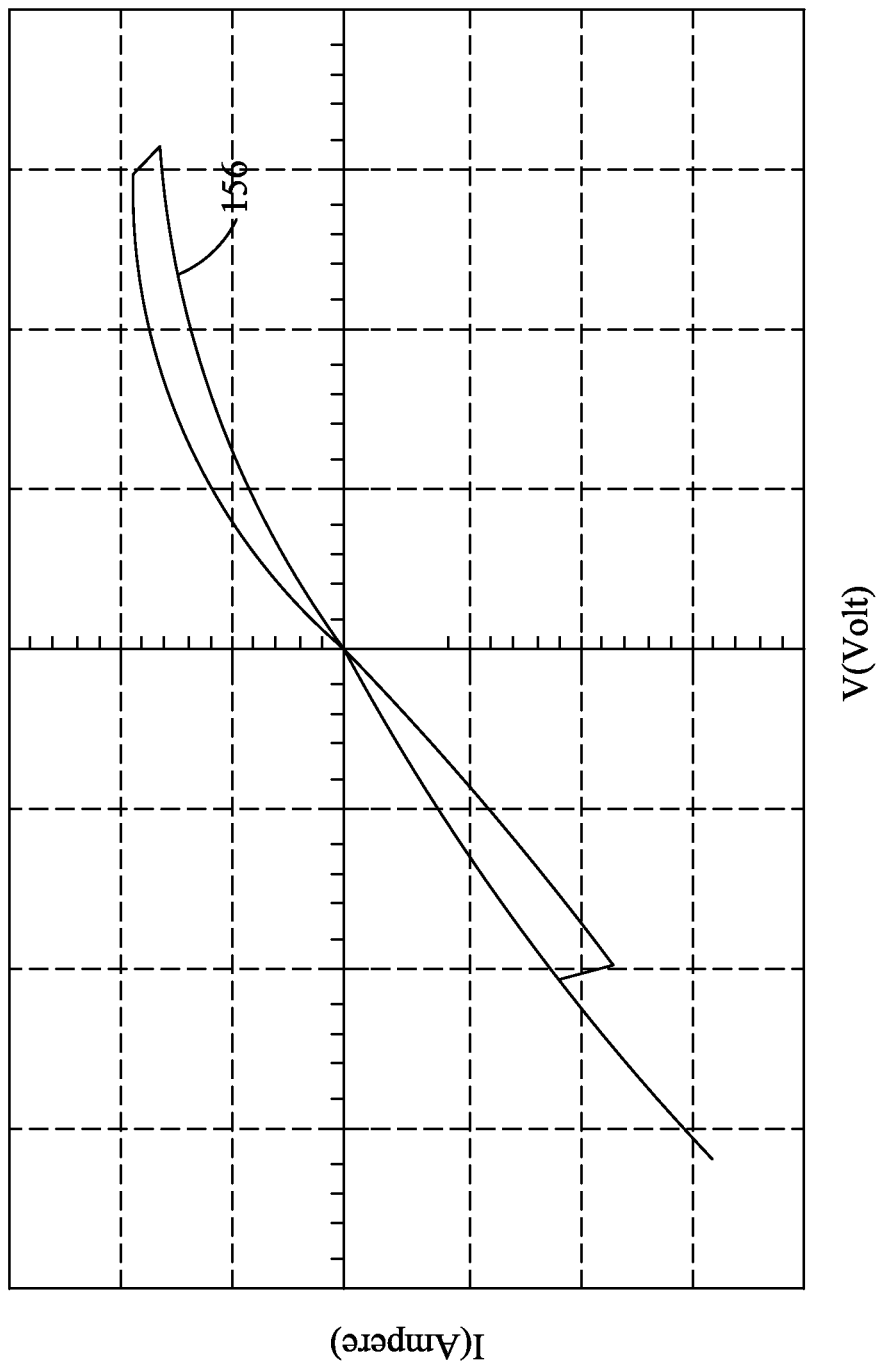
FIG. 5 is a graph illustrating a current-voltage (IV) curve that may be obtained using the test structure in accordance with another embodiment.

FIG. 5 is a graph 156 illustrating results of an IV curve test that may be performed using the test structure 100 in accordance with another embodiment. A range of voltages levels is applied to the portion of the MRAM cell 116 of the test structure 100 under test, such as the MTJ 112, the transistor 114, or both the MTJ 112 and transistor 114, and then the current is measured and plotted for each voltage level to obtain the graph 156.

The graphs 154 and 156 shown in FIGS. 4 and 5 are useful in characterizing parameters and functioning of the MRAM cell 116 to design engineers of the semiconductor device 118 and also to end users of the semiconductor device 118, for example. The test structure 100 may be used to determine a characteristic or measure a performance of the MTJ 112, the transistor 114, or both the MTJ 112 and the transistor 114 in accordance with embodiments of the present disclosure. Each component 112 or 114 of the MRAM cell 116 of the test structure 100 may have its own variation for different parameters which is useful to determine, and which is determinable using the test structure 100. The tests may be performed after wafer fabrication, for example.

Figure 6:
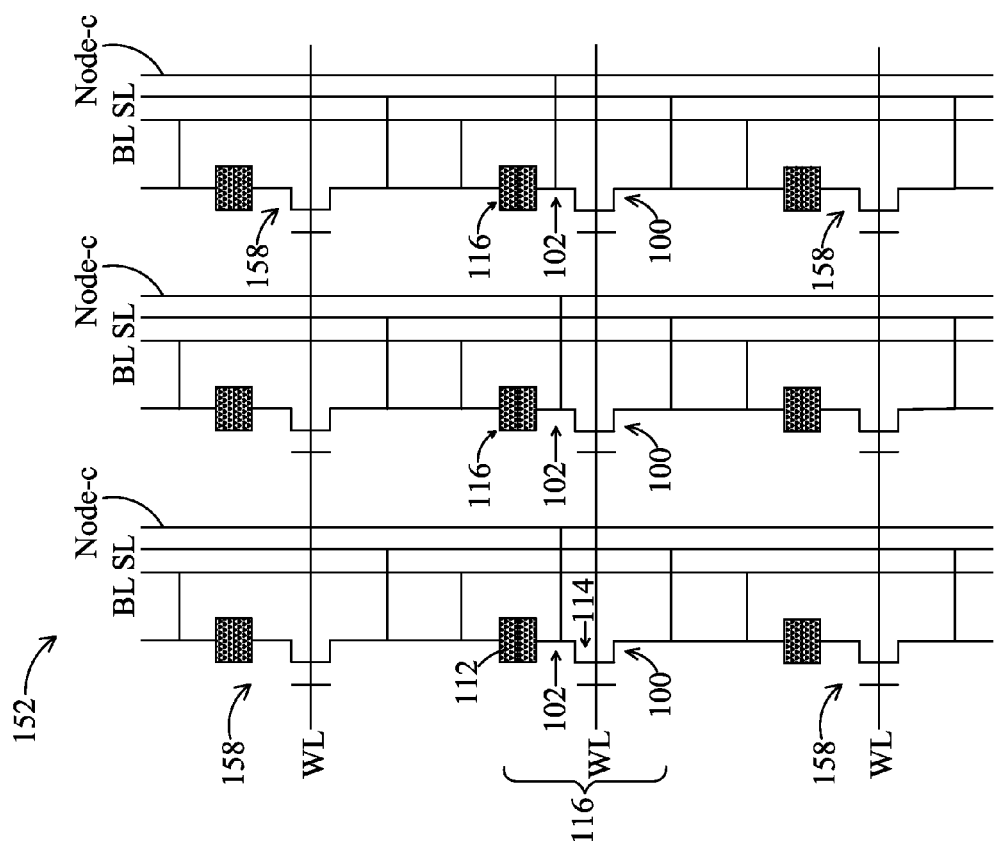
FIG. 6 is a schematic of an MRAM array in accordance with another embodiment implementing a plurality of the test structures.

In some embodiments, a single test structure 100 including the additional test node 102 and the MRAM cell 116 is included in an MRAM array 152, as shown in FIG. 3. Alternatively, the test nodes 102 and test structures 100 described herein may be implemented in a two or more rows or columns of an MRAM array 152, as shown in FIG. 6, which illustrates another embodiment of the present disclosure implemented in an MRAM array 152. One test structure 100 is formed in each column of MRAM cells 116 and 158, e.g., in one row of the MRAM array 152. The other rows in the MRAM array 152 do not include the test structure 100 in this embodiment; the other rows include MRAM cells 158.

In other words, the MRAM array 152 includes a plurality of rows and a plurality of columns of MRAM cells 116 and 158. A single test structure 100 may be included in each of the plurality of columns of MRAM cells 116, wherein the test structures 100 comprise the MRAM cell 116 in the columns. Alternatively, a test structure 100 may be included in two or more of the plurality of columns (e.g., not all of the columns) of MRAM cells 116, in accordance with other embodiments.

Embodiments of the present disclosure also include methods of manufacturing the test structure 100. The methods include forming a plurality of MRAM cells 116 and 158 over a workpiece, each MRAM cell 116 and 158 including an MTJ 112 and a transistor 114 coupled to the MTJ 112. The methods include coupling a test node 102 between the MTJ 112 and the transistor 114 of at least one MRAM cell 116 in the MRAM array 152 when fabricating the MRAM array 152. Referring again to FIG. 2, the methods further include coupling a contact pad 148 to the test node 102 between the MTJ 112 and the transistor 114 by forming the contact pad 148 on a surface 150 of a semiconductor device 118 that includes the plurality of MRAM cells 116 and 158. The contact pad 148 is coupled to a connection between the MTJ 112 and the transistor 114. For example, before the inclusion of the test node 102 in the MRAM cell 116, a stack of conductive segments 130c, 130b, 130a, and 130d and vias 128e, 128d, 128c, and 128b couples the MTJ 112 to the drain D of the transistor 114 and functions as a connection between the MTJ 112 and the transistor 114 in FIG. 2. With the inclusion of the test node 102 (Node-C), conductive segment 130d in metallization layer M1 functions as the test node 102 which is coupled to the connection region 142 and stack of conductive segments 144a, 144b, 144c, 144d, and 114e and vias 146a, 146b, 146c, 146d, and 146e in the plurality of metallization layers M1, V1, M2, V2, M3, V3, M4, V4, and M5, which couple the test node 102 to the contact pad 148.

Figure 7:
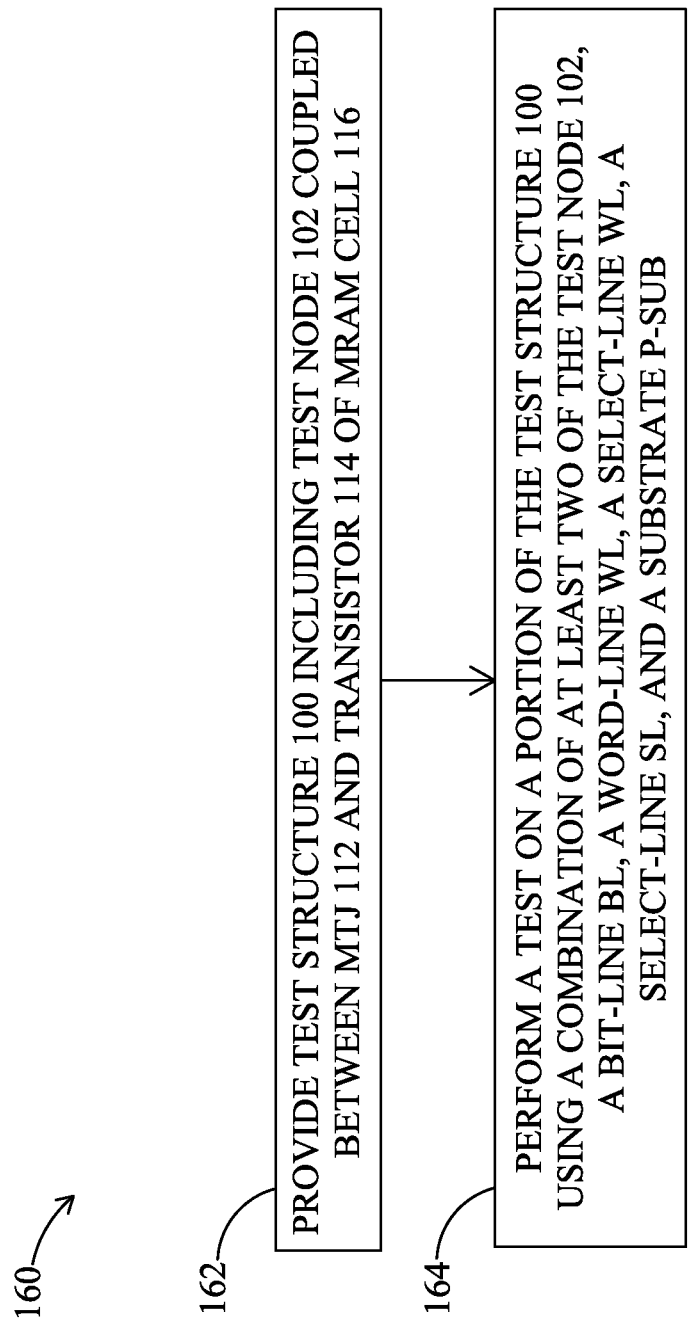
FIG. 7 is a flow chart illustrating a testing method in accordance with an embodiment.

FIG. 7 is a flow chart 160 illustrating a testing method in accordance with an embodiment. First, the test structure 100 is provided (step 162) that includes an MRAM cell 116 having an MTJ 112 coupled to a transistor 114, and a test node 102 coupled between the MTJ 112 and the transistor 114 of the MRAM cell 116. The MRAM cell 116 of the test structure 100 is coupled to a bit-line BL, a word-line WL, and a select-line SL, and the MRAM cell 116 is disposed over a substrate 120. The method includes performing a test on at least a portion of the test structure 100 using a combination of at least two of the test node 102, the bit-line BL, the word-line WL, the select-line SL, and the substrate P-sub (step 164).

Embodiments of the present disclosure include test structures 100, methods of manufacturing thereof, and testing methods. Embodiments of the present disclosure also include MRAM arrays 152 that include the novel test structures 100 described herein.

Advantages of embodiments of the disclosure include providing novel test structures 100 and MRAM arrays 152 that include an additional test node 102 that advantageously provides the ability to test different parts of the MRAM cells 116 of the test structures 100. The test structures 100 are novel test key designs that provide the ability to make embedded MRAM tests and measurements. The test structures 100 comprise a single test key that may be used to determine multiple device performance measurements of the MTJ 112, the transistor 114, or both, by using different test node options. Correlation data for the individual components of the MRAM cells 116 is possible using the novel test structures 100. The influence of variations of MTJ 112 and transistor 114 characteristics may be tested and evaluated directly using the embedded test structures 100, for example. The novel test structures 100 and methods are easily implementable in manufacturing process flows for MRAM cells 116 and arrays 152, by adding additional wiring in existing metallization layer designs.

In accordance with one embodiment of the present disclosure, a test structure includes an MRAM cell including an MTJ and a transistor coupled to the MTJ. The test structure includes a test node coupled between the MTJ and the transistor, and a contact pad coupled to the test node.

In accordance with another embodiment, a method of manufacturing a test structure includes forming a plurality of MRAM cells over a workpiece, each MRAM cell including a MTJ and a transistor coupled to the MTJ. The method includes coupling a test node to at least one of the plurality of MRAM cells between the MTJ and the transistor of the at least one of the plurality of MRAM cells, and coupling a contact pad to the test node.

In accordance with yet another embodiment, a testing method includes providing a test structure comprising an MRAM cell, the MRAM cell including an MTJ and a transistor coupled to the MTJ. The test structure includes a test node coupled between the MTJ and the transistor. The test structure is coupled to a bit-line, a word-line and a select-line and is disposed over a substrate. The method includes performing a test on at least a portion of the test structure using a combination of at least two of the test node, the bit-line, the word-line, the select-line, and the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A test structure comprising:
   a magnetic random access memory (MRAM) cell including a magnetic tunnel junction (MTJ) and a transistor coupled to the MTJ;
   a test node coupled between the MTJ and the transistor; and
   a contact pad coupled to the test node.

2. The test structure according to claim 1, wherein the transistor comprises a bipolar junction transistor (BJT) or a complementary metal oxide semiconductor (CMOS) device.

3. The test structure according to claim 1, wherein the MRAM cell comprises a spin-transfer torque (STT) switched MRAM cell.

4. The test structure according to claim 1, wherein the test node comprises a first test node, further comprising a second test node coupled to the MTJ, a third test node coupled to a gate of the transistor, and a fourth test node coupled to a source or drain of the transistor.

5. The test structure according to claim 4, wherein the transistor is disposed over a substrate, and wherein the test structure further comprises a fifth test node coupled to the substrate.

6. An MRAM array including a test structure according to claim 5.

7. The MRAM array according to claim 6, wherein the second test node is coupled to a bit-line of the MRAM array, wherein the third test node is coupled to a word-line of the MRAM array, and wherein the fourth test node is coupled to a select-line of the MRAM array.

8. The MRAM array according to claim 7, wherein the word-line is disposed over the substrate, wherein the select-line is disposed over the word-line in a first metallization layer, wherein the first test node is disposed in the first metallization layer, and wherein the bit-line is disposed in a second metallization layer disposed over the first metallization layer.

9. The MRAM array according to claim 6, wherein the MRAM array comprises a plurality of rows of MRAM cells and a plurality of columns of MRAM cells, and wherein the MRAM cell of the test structure comprises an MRAM cell in one of the plurality of rows of MRAM cells and one of the plurality of columns of MRAM cells of the MRAM array.

10. The MRAM array according to claim 6, wherein the MRAM array includes a plurality of rows of MRAM cells and a plurality of columns of MRAM cells, wherein the MRAM array includes a plurality of test structures, and wherein one of the plurality of test structures is included each of the plurality of columns of MRAM cells.

11. A method of manufacturing a test structure, the method comprising:
   forming a plurality of magnetic random access memory (MRAM) cells over a workpiece, each MRAM cell including a magnetic tunnel junction (MTJ) and a transistor coupled to the MTJ;
   coupling a test node to one of the plurality of MRAM cells between the MTJ and the transistor; and
   coupling a contact pad to the test node.

12. The method according to claim 11, wherein coupling the contact pad to the test node comprises forming the contact pad on a surface of a semiconductor device including the plurality of MRAM cells, and coupling the contact pad to a connection between the MTJ and the transistor.

13. The method according to claim 12, wherein coupling the contact pad to the connection between the MTJ and the transistor comprises forming a plurality of conductive segments and vias in a plurality of metallization layers of the semiconductor device.

14. The method according to claim 13, wherein manufacturing the test structure comprises forming a test key.

15. A testing method, including:
providing a test structure, the test structure comprising a magnetic random access memory (MRAM) cell including a magnetic tunnel junction (MTJ) and a transistor coupled to the MTJ, the test structure comprising a test node coupled between the MTJ and the transistor, wherein the test structure is coupled to a bit-line, a word-line, and a select-line and is disposed over a substrate; and
performing a test on a portion of the test structure using a combination of at least two of the test node, the bit-line, the word-line, the select-line, and the substrate.

16. The method according to claim 15, wherein performing the test comprises determining a characteristic of or measuring a performance of the MTJ, the transistor, or both the MTJ and the transistor.

17. The method according to claim 15, wherein the bit-line is coupled to the MTJ, the word-line is coupled to a gate of the transistor, the select-line is coupled to a source or drain of the transistor, and the test node is coupled to a drain or source of the transistor.

18. The method according to claim 17, wherein performing the test comprises performing the test on the MTJ using the test node and the bit-line, and wherein the test comprises a resistance-magnetic field (RH) loop test or a current-voltage (IV) curve test.

19. The method according to claim 17, wherein performing the test comprises performing the test on the transistor using the test node, the word-line, the select-line, and the substrate, and wherein the test comprises a current-voltage (IV) curve test.

20. The method according to claim 17, wherein performing the test comprises performing the test on both the MTJ and the transistor using the bit-line, the word-line, the select-line, and the substrate, and wherein the test comprises a resistance-magnetic field (RH) loop test, a current-voltage (IV) curve test for the MTJ, or an IV curve test for the transistor.

* * * * *